United States Patent
Barat et al.

(10) Patent No.: US 6,949,709 B1
(45) Date of Patent: Sep. 27, 2005

(54) METHOD FOR MAKING A DASHBOARD SUBASSEMBLY IN PATICULAR A MOTOR VEHICLE DASHBOARD CONSOLE

(75) Inventors: Didier Barat, Meudon (FR); Andrew Nash, Clairfontaine (FR)

(73) Assignees: Valeo, Paris (FR); Visteon Systemes Interieurs, La Defense Cedex (FR)

( * ) Notice: Subject to any disclaimer, the term of this patent is extended or adjusted under 35 U.S.C. 154(b) by 330 days.

(21) Appl. No.: 10/019,504

(22) PCT Filed: Jun. 30, 2000

(86) PCT No.: PCT/FR00/01843

§ 371 (c)(1),
(2), (4) Date: Jun. 5, 2002

(87) PCT Pub. No.: WO01/02149

PCT Pub. Date: Jan. 11, 2001

(30) Foreign Application Priority Data

Jun. 30, 1999 (FR) .................................. 99 08731

(51) Int. Cl.7 ............................................. B29C 45/14
(52) U.S. Cl. ..................... 174/255; 264/254; 264/263; 264/272.14; 264/272.15
(58) Field of Search ............................... 264/250, 254, 264/259, 263, 271.1, 272.11, 272.14, 272.15, 264/275, 277; 174/52.2, 254, 255; 29/857, 29/858

(56) References Cited

U.S. PATENT DOCUMENTS

| | | | | |
|---|---|---|---|---|
| 5,705,104 A | * | 1/1998 | Trublowski et al. | ........ 264/1.25 |
| 5,754,398 A | * | 5/1998 | Glovatsky et al. | ........... 361/690 |
| 6,027,679 A | * | 2/2000 | O'Brien et al. | ........ 264/272.14 |
| 6,069,319 A | * | 5/2000 | Davis et al. | ............... 174/72 A |
| 6,555,042 B1 | * | 4/2003 | Mola et al. | .................. 264/258 |

FOREIGN PATENT DOCUMENTS

| | | |
|---|---|---|
| DE | 44 24 497 | 1/1996 |
| DE | 196 50 468 | 3/1998 |
| JP | 08 111132 | 8/1996 |
| JP | 09 167539 | 10/1997 |

* cited by examiner

Primary Examiner—Angela Ortiz
(74) Attorney, Agent, or Firm—Young & Thompson

(57) ABSTRACT

The invention concerns a method for making a dashboard subassembly comprising electrical and/or electronic components (1) connected to conductors (2) and attached to a rigid support (3). The invention is characterized in that it consists in: providing a flexible mat (4) provided with said conductors (2); mounting said components (1) on said mat (4), connected to said electrical conductors (2); rigidizing said mat (4) by overmoulding it with a material designed to form said support (3). The invention also concerns a dashboard subassembly, in particular a motor vehicle dashboard console, obtained by said method.

9 Claims, 2 Drawing Sheets

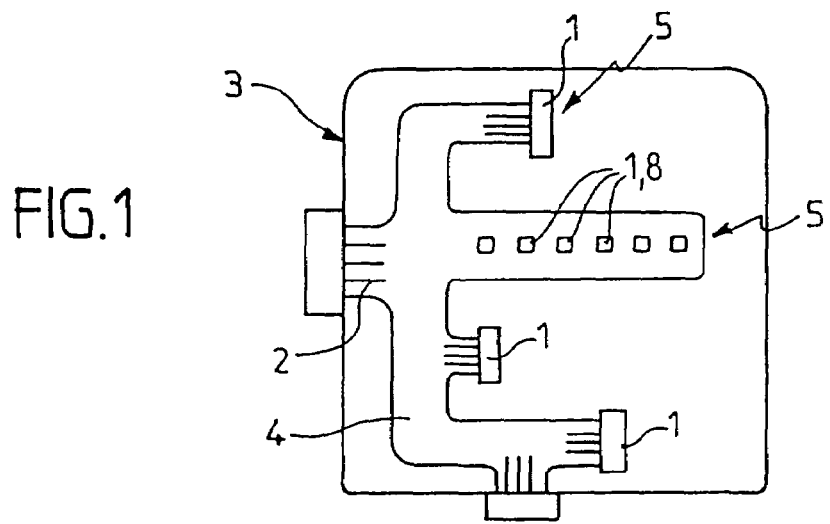
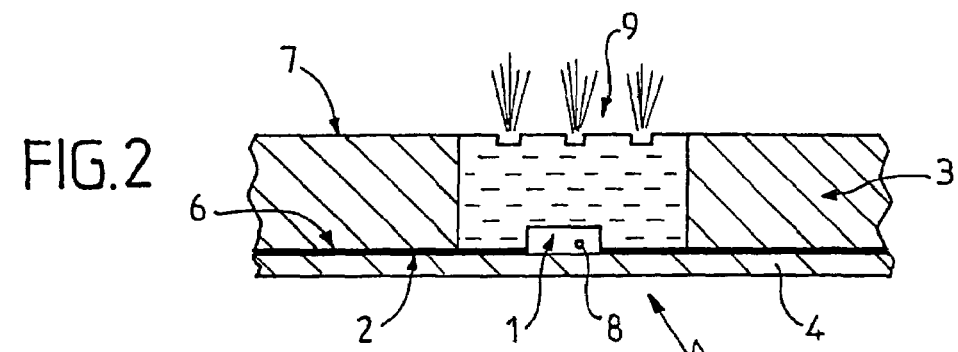
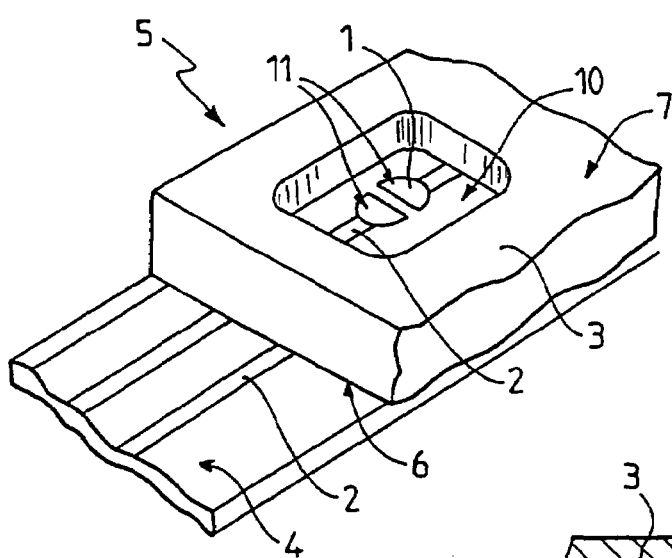
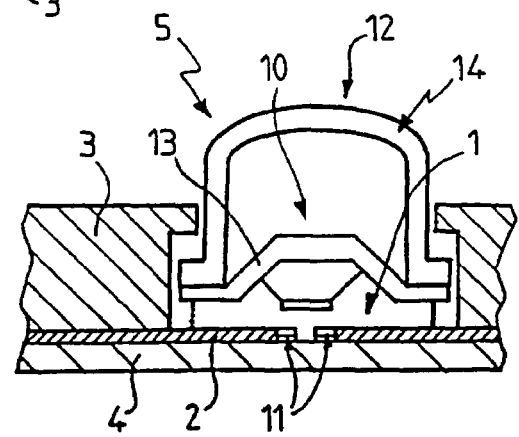

METHOD FOR MAKING A DASHBOARD SUBASSEMBLY IN PATICULAR A MOTOR VEHICLE DASHBOARD CONSOLE

FIELD OF THE INVENTION

The invention relates to a method of manufacturing a dashboard sub-assembly, and a dashboard sub-assembly, especially a vehicle-dashboard console, obtained by such a method.

BACKGROUND OF THE INVENTION

Currently, in vehicle dashboards, it is known to provide, in a part called console situated in its central region, a certain number of equipment items intended to constitute an interface between the users, principally the driver and the front passenger, and elements to be controlled such as heating, ventilation and/or air-conditioning devices, or others.

To do this, such sub-assemblies include electrical and/or electronic components, connected to conductors and fixed to a rigid support generally consisting of the body of the console.

The said electrical and/or electronic components serve, especially, to define changeover switches for the control of equipment items, indicator lamps and/or displays for the visual display of information. They may furthermore be computers, memories or other electronic components, mounted or not mounted on electronics cards.

To date, the wiring of the said components is carried out using wires cut to the required length and equipped with connection terminals, these wires being bundled together in the form of strands using adhesive tapes, tubular sleeves made of flexible plastic, these possibly being heat-shrinkable. The connection terminals are grouped together in junction boxes.

It is appreciated that this design is not well suited to variants and does not integrate the individual components. It is therefore expensive and its reliability is too often insufficient.

SUMMARY OF THE INVENTION

The object of the present invention is to propose a method of manufacturing a dashboard sub-assembly, and a dashboard sub-assembly, especially a vehicle-dashboard console, which overcome the drawbacks mentioned above and which permit a more integrated design in such a way as to reduce the number of the pieces and of the assembly operations.

Another object of the present invention is to propose a method of manufacturing a dashboard sub-assembly, and a dashboard sub-assembly, especially a vehicle-dashboard console, the reliability of which is improved.

Another object of the present invention is to propose a method of manufacturing a dashboard sub-assembly, and a dashboard sub-assembly, especially a vehicle-dashboard console, which make it possible to improve the protection of the electrical and/or electronic components used.

Other objects and advantages of the invention will appear during the description which will follow, which is given only by way of example and whose aim is not to limit the invention.

The invention first of all relates to a method of manufacturing a dashboard sub-assembly, comprising electrical and/or electronic components, connected to electrical conductors and fixed to a rigid support, characterised by the fact that, according to the said method:

a flexible web is provided, equipped with the said conductors, the said components are mounted on the said web, in connection with the said conductors, the said web is stiffened by over-moulding it with a material intended to constitute the said support.

According to an advantageous embodiment of the invention, interface means are defined with the said electrical components and the material of the said rigid support, provided locally modified and/or deformed in the region of the said components.

The invention also relates to a dashboard sub-assembly, especially a vehicle-dashboard console, obtained by the manufacturing method described above.

BRIEF DESCRIPTION OF THE DRAWINGS

The invention will be better understood on reading the following description, accompanied by the attached drawings which form an integral part of it and among which:

FIG. 1 describes, in a rear view, an embodiment example of the dashboard sub-assembly according to the invention, FIG. 2 is a view in section illustrating a first detail of an embodiment example of the dashboard sub-assembly according to the invention, FIG. 3 illustrates, in a partially cut-away perspective view, a second detail of an embodiment example of the dashboard sub-assembly according to the invention, FIG. 4 is a view in section illustrating in a complementary manner the detail represented in the preceding FIG. 3.

DESCRIPTION OF THE PREFERRED EMBODIMENTS

Figure 5:
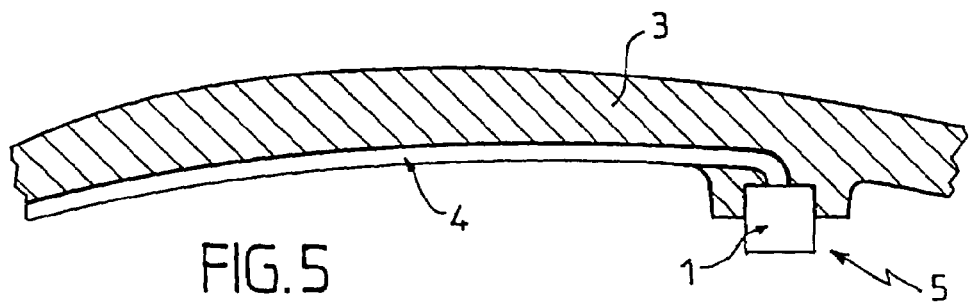
FIG. 5 is a view in section illustrating a fourth detail of an embodiment example of the dashboard sub-assembly according to the invention.

The invention first of all relates to a method of manufacturing a dashboard sub-assembly.

As illustrated in the various figures, the dash-board sub-assembly obtained by the manufacturing method according to the invention comprises electrical and/or electronic components 1 connected to electrical conductors 2 and fixed, for example continuously, to a rigid support 3.

According to the invention, a flexible web 4 equipped with the said conductors 2 is first of all provided. The conductors are, especially, conductors for supplying power and/or for the circulation of information, for example digital information, to the said components 1. Three of the said conductors 2 are provided, in particular, two for supplying power and one for the circulation of information, arranged parallel to one another along the said web. They are fixed to the latter continuously, for example, and are possibly covered with a strip of electrically insulating material.

Still according to the invention, the said components 1 are mounted on the said web 4, in connection with the said electrical conductors 2, then the said web 4 is stiffened by over-moulding it with a material intended to constitute the said support 3. Thus a solution presenting an improved level of integration is made available.

By "over-moulding" it is understood that the said support 3 comes face-to-face with one of the faces of the said web 4, substantially over all of its surface, the said support 3 and the said web 4 being fixed to one another at least by the effect of the bulk setting, during the moulding, of the material constituting the support 3. Of course, materials making it possible to strengthen the adhesion can be used.

The said electrical and/or electronic components 1 consist, for example, of computers and/or of memories. They may also be other types of electrical and/or electronic components.

On this subject, according to an advantageous embodiment of the invention, illustrated in FIGS. 2, 3, 4 and 6, interface means 5 are defined with at least one part of the said components 1 and the material of the said rigid support 3. To do this, the material of the said support is modified and/or deformed locally, before stiffening, in the region of the said components 1.

The said interface means are intended, especially, to permit a dialogue with the user, for example, by virtue of means for control by changeover switching and/or by visual-display means. They may also be intended, especially, to allow exchanges with external electrical and/or electronic circuits, for example by the circulation of supply current and/or of data. It will thus be possible to designate some of the said components 1 to form the changeover-switching and/or visual-display means.

According to such a solution, interface means such as indicator lamps, changeover switches and/or connection boxes are made available in this way, which are produced at least in part in the bulk of the said support 3.

The said web 4 is provided, for example, face-to-face with the face of the said support 3, called rear face 6, opposite that intended to be oriented towards the users, called front face 7.

As is more particularly illustrated in FIGS. 2 to 4, at least some of the components 1 and/or of the said conductors 2, for example, are designed to be between the said web 4 and the said support 3, against the said rear face 6 of the latter. They are thus sandwiched between the web 4 and the material of the said support 3 and protected. The components in question are especially those of the interface means 5 intended for the changeover switching and/or the visual display.

The said components, especially for changeover switching and/or visual display, may therefore be made visually and/or mechanically accessible via the front face 7, of the said support 3, opposite the rear face 6 of the latter.

As is more particularly illustrated in FIG. 2, the material intended to constitute the said rigid support 3 is, for example, made translucent in places to allow light to pass through the thickness of the said support, especially in the region of the components 1 intended to form visual-display means.

The latter consist, especially, of electro-luminescent components such as light-emitting diodes 8. The said diodes are, especially, soldered to the said conductor 2.

Pictograms 9, for example produced by laser etching or other means, may furthermore be provided face-to-face in the region of the front face 7 of the said rigid support 3.

As is more particularly illustrated in FIGS. 3 and 4, it is also possible to produce, locally, at least one orifice 10 opening out in the thickness of the said rigid support 3, between its front face 7 and its rear face 6, especially in the region of the components 1 intended to form changeover-switching means.

Switching means are then furthermore installed in the region of the said orifices 10, the said switching means being made able to interact, for the changeover switching, with the walls of the said orifice 10.

The said components 1 for the changeover switching consist, for example, of a discontinuity in the conductors 2, linked to conducting studs 11, defining two terminals intended to interact with the said switch means.

The latter consist, especially, of bubble membranes 12, that is to say, of a conducting strip 13, able to connect the said studs 11, and of pressure means 14, on the said strip 13. The said pressure means are designed to be electrically insulating and the said strip 13 is designed to be deformable so as to be able to pass from a first position in which it is held by the said pressure means 14 against the said studs 11 to a second position in which it is no longer in contact with the said studs 11, and vice-versa. The said pressure means are guided by the walls of the said orifice 10.

It is also possible to designate at least some of the components of the interface means 1 for connection to external circuits.

To do this, as is more particularly illustrated in FIG. 5, according to a first embodiment example, it is possible to use a said component 1 consisting of a junction box, known to the person skilled in the art and held by the said rigid support 3.

Figure 6:
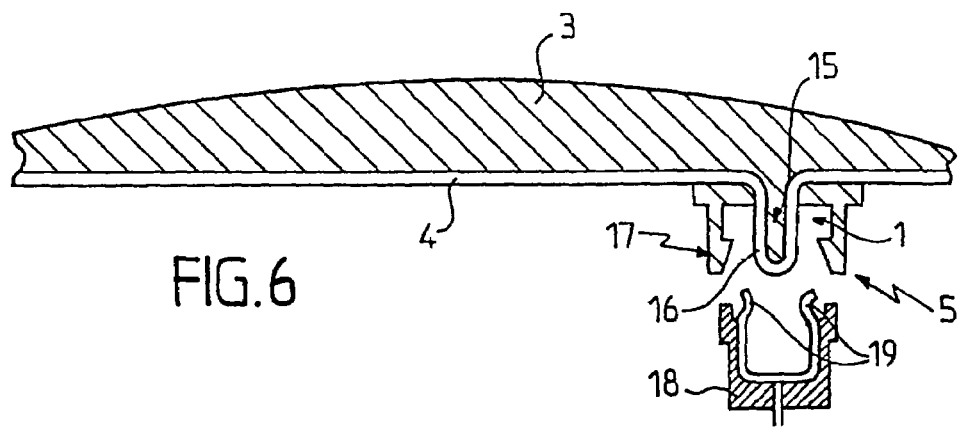
FIG. 6 illustrates an embodiment variant of the detail represented in the preceding FIG. 5.

As is more particularly illustrated in FIG. 6, according to another embodiment, the following stages are carried out:
 a protuberance 15 intended to be covered at least partly by a fold 16 of the said flexible web 4 is formed with the material of the said support 3,
 the said conductors 2 are made able to establish an electrical connection in the region of the said fold 16, especially by surface contact by virtue of localised baring of these conductors,
 mechanical fastening means 17 are arranged and/or over-moulded on the said web 4, about the said protuberance 15. Thus a connection member is made available.

The said fastening means 17 consist, for example, of a ring allowing the locking of a corresponding connector 18, about the said protuberance 15. The said connector 18 is equipped with conductors 19 able to be connected with the said conductors 2 of the fold 16.

That being so, it is possible to define, with the said rigid support 3, the body of the said sub-assembly, that is to say the piece of the latter which constitutes its structure, which makes it possible to support other components, for example mechanical components, and/or gives it its overall shape.

It is possible, particularly, for one of the faces of the said body to be intended to be oriented towards the user in order to constitute the front of the said sub-assembly. It is then possible to design the said flexible web 4 to be in the region of the face opposite the said face oriented towards the user, that is to say, for example, in the region of the said rear face 6.

It should be noted that, according to a particular embodiment, the flexible web 4 is able to accept said electrical and/or electronic components 1 on each of its faces.

That being so, the invention also relates to a dashboard sub-assembly, especially a vehicle-dashboard console, obtained by the manufacturing method described above.

Figure 7:
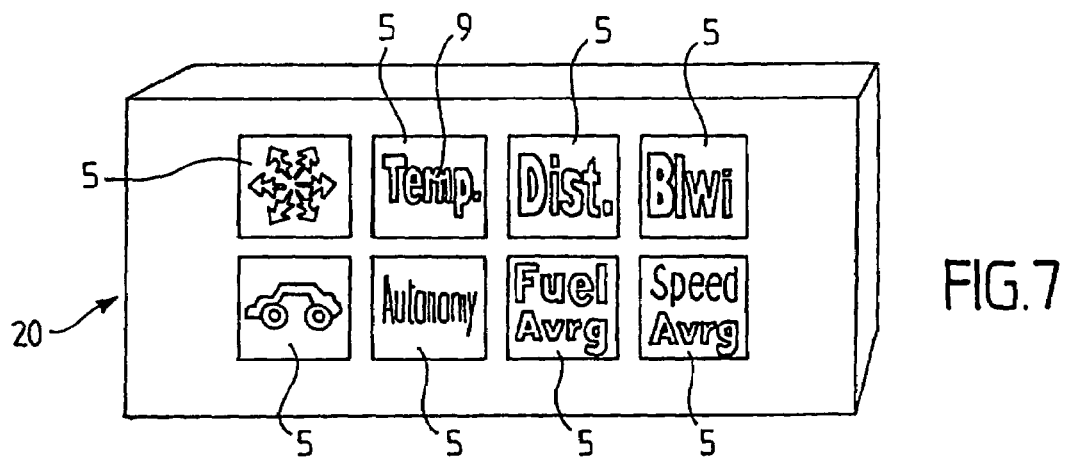
FIG. 7 illustrates, in front view, a part of an embodiment example of the dashboard sub-assembly, according to the invention, using the element detailed in FIG. 2.

As is illustrated in FIG. 7 the said sub-assembly may include visual-display screens 20 including indicator lamps 5 consisting of the visual-display means mentioned above.

Figure 8:
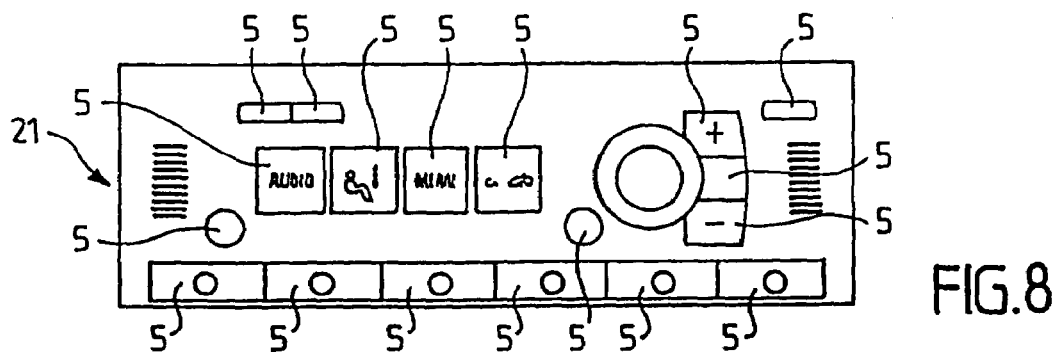
FIG. 8 illustrates, in front view, a part of an embodiment example of the dashboard sub-assembly, according to the invention, using the element detailed in FIG. 4.

As is illustrated in FIG. 8, it may also include control panels 21 including buttons 5 consisting of the changeover-switching means mentioned above.

Of course, other implementation methods, within the grasp of the person skilled in the art, could have been envisaged without to any extent departing from the scope of the invention.

What is claimed is:

1. A method of manufacturing a dashboard sub-assembly, comprising electrical and/or electronic components connected to electrical conductors and fixed to a rigid support, the method comprising the steps of:

providing a flexible web equipped with the conductors;

mounting the components on the web in connection with the conductors;

stiffening the web over molding the web with a material intended to constitute the support, wherein at least some of the components are between the web and a rear face of the support that contacts the web;

rendering the components that are between the web and the rear face of the support visually and/or mechanically accessible from a front face of the support opposite the rear face, and wherein interface means are defined with at least some of the components and further comprising a step of modifying or deforming the material of the support in a region of the components with the interface means.

2. The method according to claim 1, in which the material intended to constitute the rigid support is made translucent in places to allow light to pass through the support.

3. The method according to claim 1, in which at least one orifice is provided locally between the front face and the rear face.

4. A method of manufacturing a dashboard sub-assembly that includes electrical and/or electronic components connected to electrical conductors and fixed to a rigid support, the method comprising the steps of:

providing a flexible web equipped with the conductors;

mounting the components on the web in connection with the conductors;

stiffening the web by over molding the web with a material intended to constitute the support, wherein at least some of the components are between the web and a rear face of the support that contacts the web; and rendering at least some of the components that are between the web and the rear face of the support visually and/or mechanically accessible from a front face of the support opposite the rear face by providing an orifice between the front face and the rear face;

in which some of the components between the web and the rear face are changeover-switching means and the orifice is provided in the region of the changeover-switching means.

5. The method according to claim 4, in which switch means are installed in the region of the orifice, the switch means being made able to interact, for the changeover switching, with a wall of said orifice.

6. The method according to claim 1, in which at least one part of the components with the interface means is intended for connection to external electrical circuits by carrying out the following steps:

forming with the material of the rigid support a protuberance intended to be covered at least partly by a fold of the flexible web, establishing an electrical connection with the conductors in the region of the fold, and arranging mechanical fastening means on the web about the protuberance.

7. A method of manufacturing a dashboard sub-assembly, comprising electrical and/or electronic components connected to electrical conductors and fixed to a rigid support, the method comprising the steps of:

providing a flexible web equipped with the conductors;

mounting the components on the web in connection with the conductors;

stiffening the web over molding the web with a material intended to constitute the support, wherein at least some of the components are between the web and a rear face of the support that contacts the web; and rendering the components that are between the web and the rear face of the support visually and/or mechanically accessible from a front face of the support opposite the rear face;

in which a body of the sub-assembly is defined by the rigid support.

8. The method according to claim 7, wherein the web is provided on a surface of the body opposite a surface of the body intended to be oriented towards the user.

9. A dashboard sub-assembly obtained by the manufacturing method according to claim 1.

* * * * *